(12) United States Patent
Takayama et al.

(10) Patent No.: US 9,966,273 B2
(45) Date of Patent: May 8, 2018

(54) PLASMA ETCHING METHOD

(71) Applicant: Tokyo Electron Limited, Tokyo (JP)

(72) Inventors: Wataru Takayama, Miyagi (JP); Sho Tominaga, Miyaga (JP); Yoshiki Igarashi, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days. days.

(21) Appl. No.: 15/361,675

(22) Filed: Nov. 28, 2016

(65) Prior Publication Data

US 2017/0162399 A1 Jun. 8, 2017

(30) Foreign Application Priority Data

Dec. 3, 2015 (JP) .................................. 2015-236624

(51) Int. Cl.
*H01L 21/311* (2006.01)
*H01L 27/11582* (2017.01)
*H01L 27/11556* (2017.01)

(52) U.S. Cl.
CPC .. *H01L 21/31116* (2013.01); *H01L 27/11582* (2013.01); *H01L 27/11556* (2013.01)

(58) Field of Classification Search
CPC ......... H01L 21/31116; H01L 27/11556; H01L 27/11582
See application file for complete search history.

(56) References Cited

U.S. PATENT DOCUMENTS

| 6,287,974 B1* | 9/2001 | Miller | H01L 21/3065 257/E21.218 |
| 6,686,292 B1* | 2/2004 | Yang | H01L 21/3065 257/E21.218 |
| 2014/0134846 A1* | 5/2014 | Hirayama | H01J 37/32082 438/703 |
| 2015/0332932 A1* | 11/2015 | Hirotsu | H01L 21/31144 438/723 |

FOREIGN PATENT DOCUMENTS

JP         2015-144158         8/2015

* cited by examiner

*Primary Examiner* — Duy Deo
*Assistant Examiner* — Mahmoud Dahimene
(74) *Attorney, Agent, or Firm* — IPUSA, PLLC

(57) ABSTRACT

There is provided a plasma etching method. The plasma etching method includes generating plasma, by using a first high frequency power output from a first high frequency power supply, from a first processing gas that contains fluorine-containing gas, thereby etching a laminated film of a silicon oxide film and a silicon nitride film through the generated plasma, and generating plasma, by using the first high frequency power, from a second processing gas that contains bromine-containing gas, thereby etching the laminated film through the generated plasma.

8 Claims, 6 Drawing Sheets

PLASMA ETCHING METHOD

CROSS-REFERENCE TO RELATED APPLICATION

The present application is based upon and claims the benefit of priority of Japanese Patent Application No. 2015-236624, filed on Dec. 3, 2015, the entire contents of which are incorporated by reference in their entirety.

BACKGROUND OF THE PRESENT INVENTION

1. Field of the Present Invention

The present disclosure relates to plasma etching methods.

2. Description of the Related Art

In producing three dimensional laminated semiconductor memories such as 3D-NAND flash memories, a method is known, in which a laminated film of a silicon oxide film and a silicon nitride film is etched through a plasma etching, thereby forming a hole or trench with high aspect ratio.

According to the method, a gap or unevenness (scallop shape) may be created at an interface between the silicon oxide film and the silicon nitride film in a case where the etching speeds for the silicon oxide film and for the silicon nitride film are different. When such a gap is created, for example, reliability of a product may decrease because the film formed on the hole or trench may be easily peeled in a later stage of the production.

Therefore, conventionally, for example, the laminated film is etched by plasma etching process using a mixture of NF3 gas and CH3F gas to suppress generation of the scalloping (e.g., Patent Document 1).

However, although the scalloping generated in the etching process of the laminated film can be suppressed according to the method of Patent Document 1, the Patent Document 1 does not disclose a method for removing the scalloping that has been already formed. Therefore, according to the conventional technology, etching shape may be degraded in a case where the scalloping is created at the interface between the silicon oxide film and the silicon nitride film during the etching process performed on the laminated film of the silicon oxide film and the silicon nitride film.

[Patent Document 1]: Japanese Laid-open Patent Publication No. 2015-144158

SUMMARY OF THE PRESENT DISCLOSURE

An object of the present disclosure is to remove gaps created at an interface between the silicon oxide film and the silicon nitride film.

According to an embodiment of the invention, there is provided a plasma etching method. The plasma etching method includes generating plasma, by using a first high frequency power output from a first high frequency power supply, from a first processing gas that contains fluorine-containing gas, thereby etching a laminated film of a silicon oxide film and a silicon nitride film through the generated plasma, and generating plasma, by using the first high frequency power, from a second processing gas that contains bromine-containing gas, thereby etching the laminated film through the generated plasma.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF PREFERRED EMBODIMENTS

Figure 1:
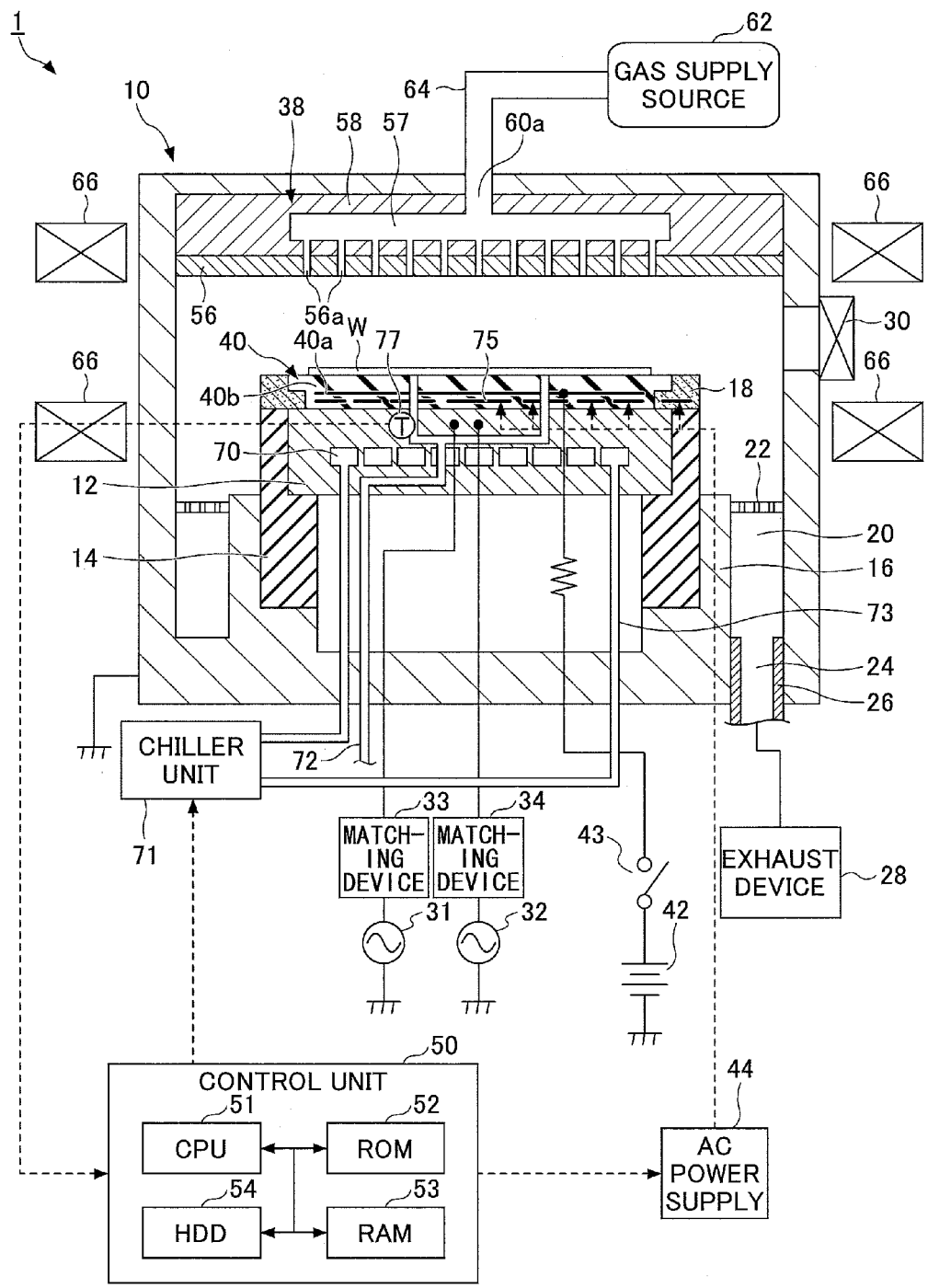
FIG. 1 is an example cross sectional view of a plasma etching apparatus.

Herein below, embodiments will be described with reference to the accompanying drawings. Additionally, in the present specification and drawings, identical reference numerals will be applied to elements or the like that have substantially similar functions and configurations to those in another embodiment, and descriptions thereof may be omitted.

<General Arrangement of Plasma Etching Apparatus>

First, a plasma etching apparatus of an embodiment of the present disclosure will be described with reference to FIG. 1. FIG. 1 is an example cross sectional view of a plasma etching apparatus of the present embodiment.

For example, the plasma etching apparatus 1 includes a cylindrical processing chamber 10 made of aluminum having an alumite-treated (anodized) surface. The processing chamber 10 is grounded.

A mounting table 12 is disposed inside the processing chamber 10. For example, the mounting table 12 may be made of aluminum Al, titanium Ti, silicon carbide SiC, etc., and supported by supporting member 16 via an insulated holding member 14. Thus, the mounting table 12 is disposed at the bottom of the processing chamber 10.

An exhaust pipe 26 is formed at the bottom of the processing chamber 10, and the exhaust pipe 26 is coupled to an exhaust device 28. The exhaust device 28 includes a vacuum pump such as a turbomolecular pump and a dry pump. The exhaust device 28 depressurizes processing area inside the processing chamber 10 to a predetermined vacuum degree, and leads gas in the processing chamber 10 to an exhaust path 20 to eject from an exhaust port 24. A baffle plate 22 for controlling gas flow is disposed in the exhaust path 20.

A gate valve 30 is provided at a side wall of the processing chamber 10. A wafer W is carried out from the processing chamber 10 by controlling open/close of the gate valve 30.

A first high frequency power supply 31 for generating plasma is connected to the mounting table 12 via a matching device 33. A second high frequency power supply 32 for drawing ion included in the plasma to the wafer W is connected to the mounting table 12 via the matching device 34. The first high frequency power supply 31 applies first high frequency power HF (radio frequency power for generating plasma) at a first frequency, e.g., 100 MHz, to the mounting table 12, where the first frequency is appropriate for generating plasma in the processing chamber 10. The second high frequency power supply 32 applies second high frequency power LF (radio frequency power for generating bias voltage) at second frequency less than the first frequency, e.g., 3.2 MHz to the mounting table 12, where the second frequency is appropriate for drawing ion in the plasma to the wafer W mounted on the mounting table 12. For example, the second high frequency power LF is applied in synchronization with the first high frequency power HF. Thus, the wafer W is mounted on the mounting table 12, while the mounting table 12 serves as a lower electrode.

An electrostatic chuck 40 for holding the wafer W by an electrostatic attractive force is provided on the top surface of the mounting table 12. The electrostatic chuck 40 includes a pair of insulators 40b (or insulation sheets) and a chuck electrode 40a disposed between the insulators 40b. A DC voltage supply 42 is coupled to the chuck electrode 40a via a switch 43. The electrostatic chuck 40 electrostatically attracts and holds the wafer W by a Coulomb force that is generated when a DC voltage is applied thereto from the DC voltage supply 42. A temperature sensor 77 is provided for the electrostatic chuck 40 to measure temperature of the electrostatic chuck 40. Thus, temperature of the wafer W on the electrostatic chuck 40 can be measured.

A focus ring 18 is arranged on an outer edge of the electrostatic chuck 40 surrounding the outer edge of the mounting table 12. For example, the focus ring 18 is made of silicon or quartz. The focus ring 18 improves in-plane etching uniformity.

A gas shower head 38 that serves as an upper electrode at a ground potential is provided at a ceiling portion of the chamber 10. Thus, the first high frequency power HF from the first high frequency power supply 31 is capacitively applied between the mounting table 12 and the gas shower head 38.

The gas shower head 38 includes an electrode plate 56 having multiple gas holes 56a and an electrode supporting body 58 detachably holding the electrode plate 56. A gas supply source 62 supplies gas to the gas shower head 38 via a gas supply pipe 64, which is connected to a gas inlet 60a. The gas is diffused in a gas diffusion space 57 and introduced into inside of the chamber 10 from the multiple gas holes 56a. A magnet 66 is arranged to extend annularly or concentrically around the chamber 10 so as to preform control of plasma within a plasma generation space of the chamber 10 between the upper electrode and a lower electrode by means of the magnetic force of the magnet 66.

A heater 75 may be integrated in the electrostatic chuck 40. Also, the heater 75 may be attached to a backside surface of the electrostatic chuck 40 instead of being integrated in the electrostatic chuck 40. Current output from an AC power supply 44 is supplied to the heater 75 via a power supply line. Thus, the heater 75 heats the mounting table 12.

A coolant path 70 is formed within the mounting table 12. A coolant (hereinafter also referred to as "Brine") is supplied from a chiller unit 71 flows in the coolant path 70 and a coolant circulation pipe 73, thereby cooling the mounting table 12.

According to the aforementioned configuration, the mounting table 12 is cooled by the brine flowing in the coolant path 70 in the mounting table 12. Thus, the temperature of the wafer W is adjusted to be a desired temperature. Also, heat transfer gas such as helium (He) is supplied between the top surface of the electrostatic chuck 40 and the backside surface of the wafer W through a heat transfer gas supply line 72.

A control unit 50 includes a CPU 51, a ROM (Read Only Memory) 52, a RAM (Random Access Memory) 53 and a HDD (Hard Disk Drive) 54. The CPU 51 performs plasma processing including etching in accordance with a process set in a recipe stored in a storage unit in the ROM 52, the RAM 53, or the HDD 54. Also, data including data table (described below) is stored in the storage unit. The control unit 50 controls temperature of the heating mechanism using the heater 75 and the cooling mechanism using the brine.

When the plasma etching is performed in the plasma etching apparatus 1, the wafer W is loaded into the chamber 10 from the gate valve 30, which is controlled to open, and the wafer W is placed on the electrostatic chuck 40. After the wafer W is loaded, the gate valve 30 is closed. The internal pressure of the chamber 10 is reduced to a predetermined pressure by the exhaust device 28. A voltage from the DC voltage supply 42 is applied to the electrode 40a of the electrostatic chuck 40 so that the wafer W is fixed to the electrostatic chuck 40.

Then, a certain gas is sprayed into the chamber 10 from the gas shower head 38, and the first high frequency power HF for exciting the gas into plasma is applied to the mounting table 12. When the introduced gas is ionized and dissociated by the first high frequency power HF, the plasma is generated and the plasma etching is performed on the wafer W due to the plasma. The second high frequency power LF for generating the bias voltage may be applied to the mounting table 12. After finishing the plasma etching, the wafer W is carried outside the chamber 10.

<Plasma Etching Method>

Figure 2A:
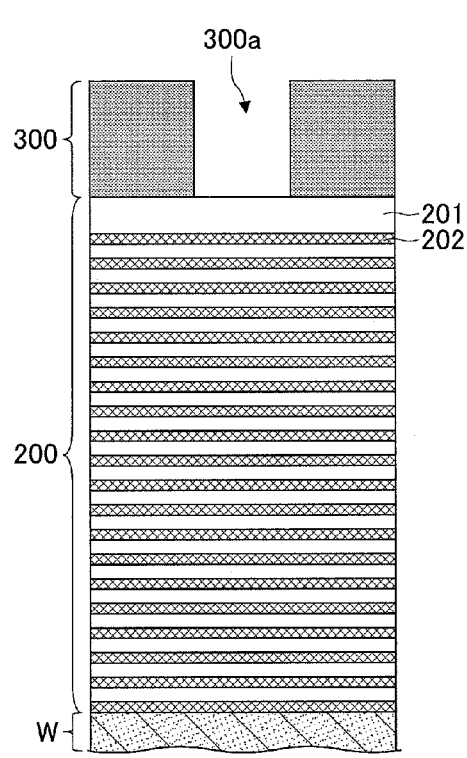
FIG. 2A is a diagram schematically illustrating cross section of laminated film before etching.
Figure 2B:
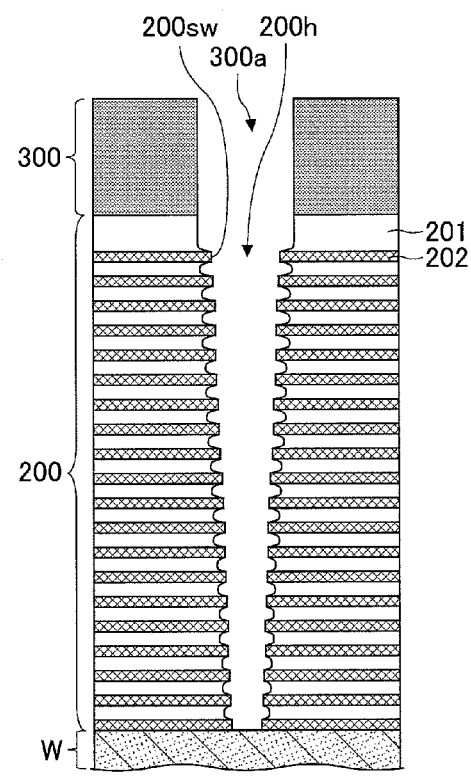
FIG. 2B is a diagram schematically illustrating cross section of laminated film after etching.

In the following, an etching process performed on a laminated film of the silicon oxide film ($SiO_2$) and the silicon nitride film (SiN) using fluorine-containing gas will be described with reference to FIG. 2. FIG. 2A is a diagram schematically illustrating cross section of the laminated film before the etching. FIG. 2B is a diagram schematically illustrating cross section of the laminated film after the etching.

As illustrated in FIG. 2A, a laminated film 200 is formed on the wafer W, in which a plurality of silicon oxide films 201 and a plurality of silicon nitride films 202 are alternately laminated. A mask film 300 having an opening 300a is formed on the laminated film 200. For example, the wafer W is a silicon wafer. For example, the mask film 300 is a polysilicon film, an organic film, an amorphous carbon film, or a titanium nitride film.

As illustrated in FIG. 2B, a hole 200h is formed in the laminated film 200 when an etching process is performed on the laminated film 200 with the mask film 300 as an etching mask, where the plasma is generated from a first processing gas containing the fluorine-containing gas. At this time, in a side wall 200sw of the hole 200h formed in the laminated film 200, gaps or unevenness (scalloping) may be created at the interface between the silicon oxide film 201 and the silicon nitride film 202. The scalloping is formed because a speed (etching speed) at which the silicon oxide film 201 is etched is different from a speed at which the silicon nitride film 202 is etched. When such a scalloping at the interface between the silicon oxide film 201 and the silicon nitride film 202 is created, for example, reliability of a product may decreases because the film formed, in a step performed after the hole 200h is formed, on the hole 200h may be easily peeled. The scalloping at the interface between the silicon oxide film 201 and the silicon nitride film 202 is likely to be created in a case where the etching process is performed on the wafer W at an extremely low temperature, which is equal to or less than −30° C. Additionally, the first processing gas may include a hydrogen-containing gas.

A shape of a hole 200h is described as an example, where the hole 200h is formed by performing etching process on the laminated film 200 of the silicon oxide film 201 and the silicon nitride film 202 under a process condition of an extremely low temperature environment. The process condition is described as follows.

Temperature set for the chiller unit is −60° C.
Gas is hydrogen ($H_2$)/carbon tetrafluoride ($CF_4$)/trifluoromethane ($CHF_3$).
Pressure is 60 mTorr (8.0 Pa).
First high frequency power HF is applied as continuous wave of 2500 W.
Second high frequency power LF is applied as pulse wave of 4000 W at a frequency of 0.3 kHz, whose duty ratio is 55%.

Figure 3:
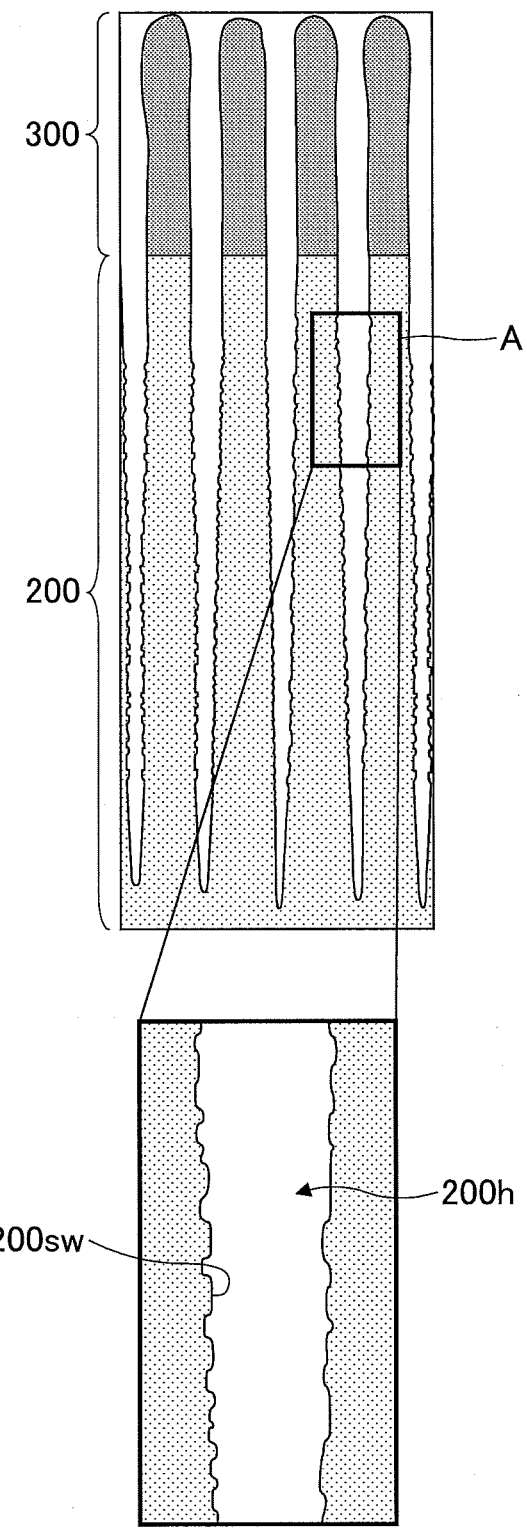
FIG. 3 is a diagram illustrating unevenness created at an interface between a silicon oxide film and a silicon nitride film.

FIG. 3 is a diagram illustrating the scalloping created at the interface between the silicon oxide film and the silicon nitride film, where the lower portion thereof illustrates an enlarged cross sectional view corresponding to an area "A" illustrated in the upper portion thereof.

As illustrated in FIG. 3, in a case where the laminated film 200 is etched by plasma generated from the first processing gas that contains fluorine-containing gas using the mask film 300 as the etching mask, the scalloping is formed at the side wall 200sw of the hole 200h formed in the laminated film 200.

Therefore, in the following, plasma etching methods of a first embodiment and a second embodiment of the present disclosure will be described, with which the scalloping formed at the interface between the silicon oxide film 201 and the silicon nitride film 202 in the etching process of the laminated film 200 can be removed.

First Embodiment

Figure 4:
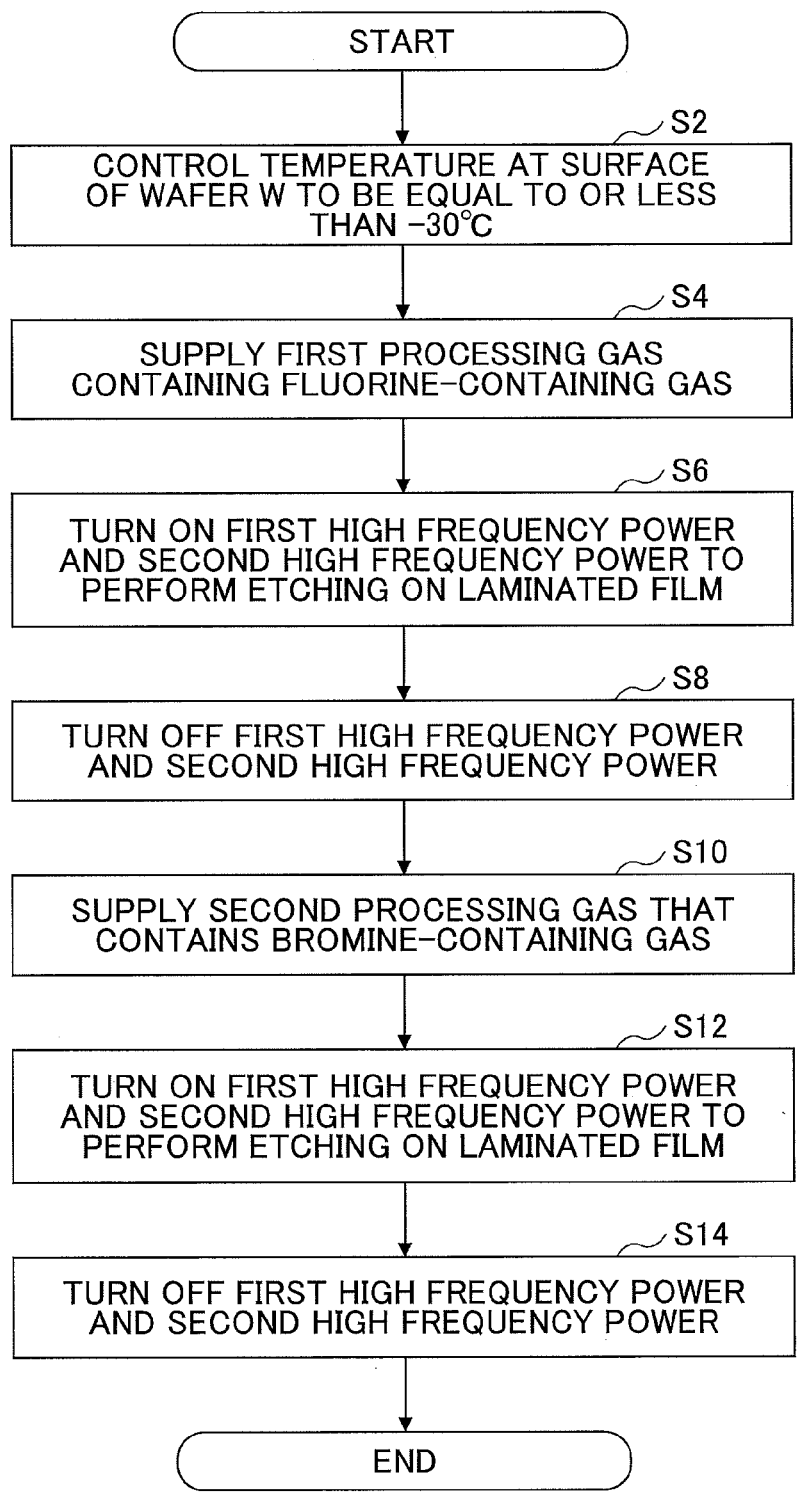
FIG. 4 is a flowchart illustrating an example plasma etching method of a first embodiment.

In the following, the plasma etching method of the first embodiment will be described with reference to FIG. 4. FIG. 4 is a flowchart illustrating an example plasma etching method of the first embodiment.

As illustrated in FIG. 4, first, in the plasma etching method of the present embodiment, the temperature at the surface of the wafer W is controlled to be an extremely low temperature equal to or less than −30° C. (step S2). Then, the first processing gas containing fluorine-containing gas is supplied into the processing chamber 10 (step S4). For example, a processing gas containing $H_2$/$CF_4$/$CHF_3$ is supplied.

The laminated film 200 of the silicon oxide film 201 and the silicon nitride film 202 is etched by using the first processing gas (step S6: first operation). Specifically, the first high frequency power HF is output (turned on) from the first high frequency power supply 31 to apply the high frequency power for generating plasma to the mounting table 12. Also, the second high frequency power LF is output (turned on) from the second high frequency power supply 32 to apply the high frequency power for generating the bias voltage to the mounting table 12. At this time, the first high frequency power HF and the second high frequency power LF may be continuous waves or pulse waves. Processing time (predetermined period) of the first operation is defined in accordance with a depth of the hole 200h formed in the laminated film 200, an output power of the first high frequency power HF, an output power of the second high frequency power LF, and the like. When the predetermined time period passes, the first high frequency power HF and the second high frequency power LF are turned off (step S8).

Then, a second processing gas is supplied in the processing chamber 10, where the second processing gas is generated by adding a bromine-containing gas to the first processing gas that contains fluorine-containing gas (step S10). For example, a processing gas containing $H_2$/$CF_4$/$CHF_3$/hydrogen bromide (HBr) is supplied.

Then, the laminated film 200 of the silicon oxide film 201 and the silicon nitride film 202 are etched by using the second processing gas (step S12: second operation). Specifically, the first high frequency power HF is output (turned on) from the first high frequency power supply 31 so that the high frequency power for generating plasma is applied to the mounting table 12. Also, the second high frequency power LF is output (turned on) from the second high frequency power supply 32 so that the high frequency power for generating the bias voltage is applied to the mounting table 12. At this time, the first high frequency power HF may be continuous wave or pulse wave. The second high frequency power LF is preferably the continuous wave. Processing time (predetermined period) of the second operation is defined in accordance with an output power of the first high frequency power HF, an output power of the second high frequency power LF, and the like. When the predetermined time period passes, the first high frequency power HF and the second high frequency power LF are turned off (step S14).

In this way, the hole 200h is formed in the laminated film 200.

Additionally, although in the present embodiment, the first high frequency power HF and the second high frequency power LF are turned off after performing the first operation, and the first high frequency power HF and the second high frequency power LF are turned on again in the second operation, this is not a limiting example. For example, the second operation may be subsequently performed after the first operation without turning off the first high frequency power HF and the second high frequency power LF.

Specifically, the plasma etching is performed on the laminated film 200 of the silicon oxide film 201 and the silicon nitride film 202 using the mask film 300 as the etching mask under a process condition described below. The process condition is described below.

<First Operation>
Temperature set for the chiller unit is −60° C.
Gas is hydrogen ($H_2$)/carbon tetrafluoride ($CF_4$)/trifluoromethane ($CHF_3$).
Pressure is 60 mTorr (8.0 Pa).
First high frequency power HF is applied as continuous wave of 2500 W.
Second high frequency power LF is applied as pulse wave of 4000 W at a frequency of 0.3 kHz, whose duty ratio is 55%.

<Second Operation>
Temperature set for the chiller unit is −60° C.
Gas is $H_2$/$CF_4$/$CHF_3$/hydrogen bromide (HBr).
Pressure is 60 mTorr (8.0 Pa).
First high frequency power HF is applied as continuous wave of 2500 W.

Second high frequency power LF is applied as continuous wave of 5500 W.

A comparative example of the plasma etching is performed under a process condition described below, where the process condition of the comparative example is similar to that of the first embodiment except the HBr is not added in the second operation. The process condition of the comparative example is described below.

<First Operation>
Temperature set for the chiller unit is −60° C.
Gas is $H_2/CF_4/CHF_3$.
Pressure is 60 mTorr (8.0 Pa).
First high frequency power HF is applied as continuous wave of 2500 W.
Second high frequency power LF is applied as pulse wave of 4000 W at a frequency of 0.3 kHz, whose duty ratio is 55%.

<Second Operation>
Temperature set for the chiller unit is −60° C.
Gas is $H_2/CF_4/CHF_3$.
Pressure is 60 mTorr (8.0 Pa).
First high frequency power HF is applied as continuous wave of 2500 W.
Second high frequency power LF is applied as continuous wave of 5500 W.

Figure 5A:
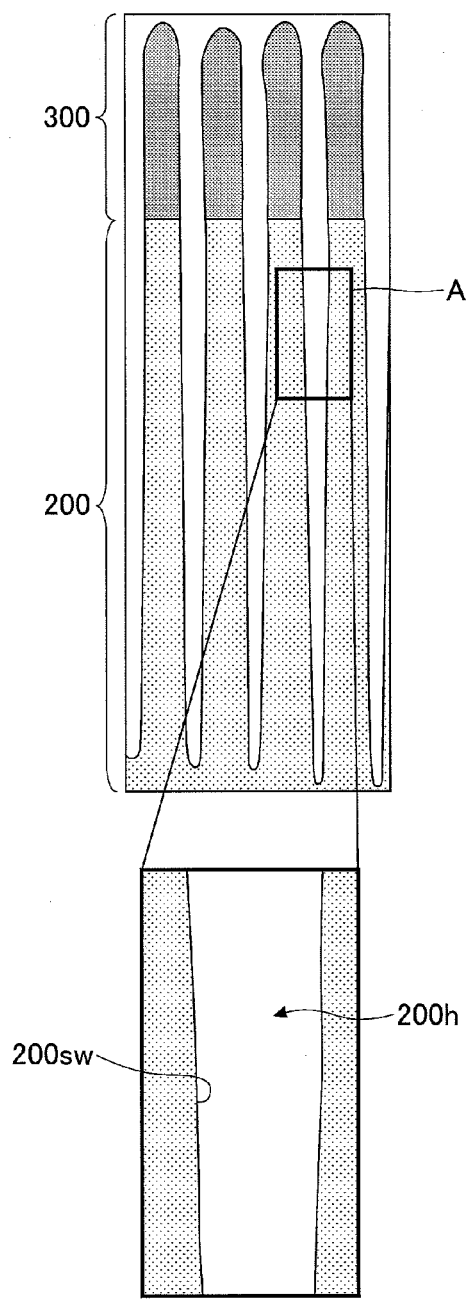
FIG. 5A is a cross section sectional view of the laminated film on which a second operation of the first embodiment is performed.
Figure 5B:
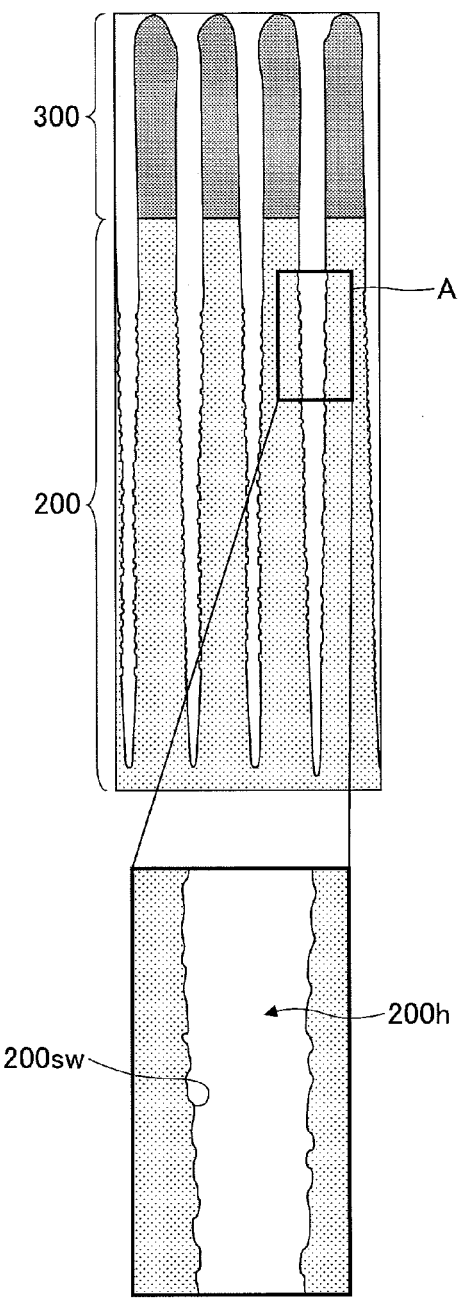
FIG. 5B is a cross sectional view of the laminated film on which the second operation of the comparative example is performed.

FIG. 5A and FIG. 5B are diagrams illustrating an example result of the plasma etching of the first embodiment, where lower portions of FIG. 5A and FIG. 5B indicate enlarged cross sectional views corresponding to areas "A" illustrated in upper portions of FIG. 5A and FIG. 5B. Specifically, in FIG. 5A, a cross section of the laminated film 200, on which the second operation of the first embodiment is performed after the first operation is performed, is illustrated. In FIG. 5B, across section of the laminated film 200, on which the second operation of the comparative example is performed after the first operation is performed, is illustrated.

As illustrated in FIG. 5A, the scalloping created, in the first operation, at the interface between the silicon oxide film 201 and the silicon nitride film 202 can be removed by etching the laminated film 200, in the second operation, using the second processing gas that contains HBr as the etching gas. When Hbr is added in the second operation, silicon is sputtered from the laminated film 200 to deposit in a concaved portion of the scalloping formed at the interface between the silicon oxide film 201 and the silicon nitride film 202 while a convex portion of the scalloping is removed, thereby flattening the unevenness. In view of fostering the removing of the convex portion of the scalloping, the second high frequency power LF is preferably applied in the second operation, and in particular, the second high frequency power LF is greater than the first high frequency power HF. Also, when the HBr is applied, deference between an etching speed of the silicon oxide film 201 and an etching speed of the silicon nitride film 202 can be decreased. Therefore, in the second operation, the scalloping is unlikely to be formed at the interface of the silicon oxide film 201 and the silicon nitride film 202 in comparison to the first operation.

Also, in the first operation, the laminated film 200 is etched without adding HBr. Therefore, the hole 200h can be formed in the laminated film 200 without reducing a selective ratio (mask selective ratio) of the mask film 300 with respect to the laminated film 200.

In contrast, as illustrated in FIG. 5B, in a case where HBr is not added in the second operation, the scalloping formed at the interface between the silicon oxide film 201 and the silicon nitride film 202 is hardly suppressed.

Additionally, in the present embodiment, although the pressure in the processing chamber 10 in the second operation is set to be 60 mTorr (8.0 Pa), the pressure in the processing chamber 10 may be equal to or less than 60 mTorr (8.0 Pa). For example, the pressure in the processing chamber 10 may be 25 mTorr (3.3 Pa) or 15 mTorr (2.0 Pa). When the pressure in the processing chamber 10 in the second operation is set to be low, a diameter of a bottom of the hole 200h (bottom CD) formed in the laminated film 200 can be increased. Consequently, a verticality of the side wall 200sw of the hole 200h formed in the laminated film 200 can be improved as well as the removability of the unevenness at the interface between the silicon oxide film 201 and the silicon nitride film 202.

As described above, in the plasma etching method of the first embodiment, the laminated film 200 is etched using the second processing gas that contains the bromine-containing gas after the laminated film 200 is etched using the first processing gas that contains fluorine-containing gas. Thus, the scalloping formed at the interface between the silicon oxide film 201 and the silicon nitride film 202 can be removed.

Second Embodiment

In the following, a plasma etching method of the second embodiment will be described. In the first embodiment, the second processing gas, which is used in the second operation, is generated by adding bromine-containing gas to the first processing gas, which is used in the first operation. On the other hand, in the second embodiment, the second processing gas, which is used in the second operation, is generated by adding bromine-containing gas to a processing gas, which is different from the first processing gas used in the first operation.

Specifically, the plasma etching is performed on the laminated film 200 of the silicon oxide film 201 and the silicon nitride film 202 using the mask film 300 as the etching mask under a process condition described below. The process condition is described as follows.

<First Operation>
Temperature set for the chiller unit is −60° C.
Gas is $H_2/CF_4/CHF_3$.
Pressure is 60 mTorr (8.0 Pa).
First high frequency power HF is applied as continuous wave of 2500 W.
Second high frequency power LF is applied as pulse wave of 4000 W at a frequency of 0.3 kHz, whose duty ratio is 55%.

<Second Operation>
Temperature set for the chiller unit is −60° C.
Gas is difluoromethane ($CH_2F_2$)/methane ($CH_4$)/nitrogen trifluoride ($NF_3$).
Pressure is 60 mTorr (8.0 Pa).
First high frequency power HF is applied as continuous wave of 2500 W.
Second high frequency power LF is applied as continuous wave of 5500 W.

Figure 6:
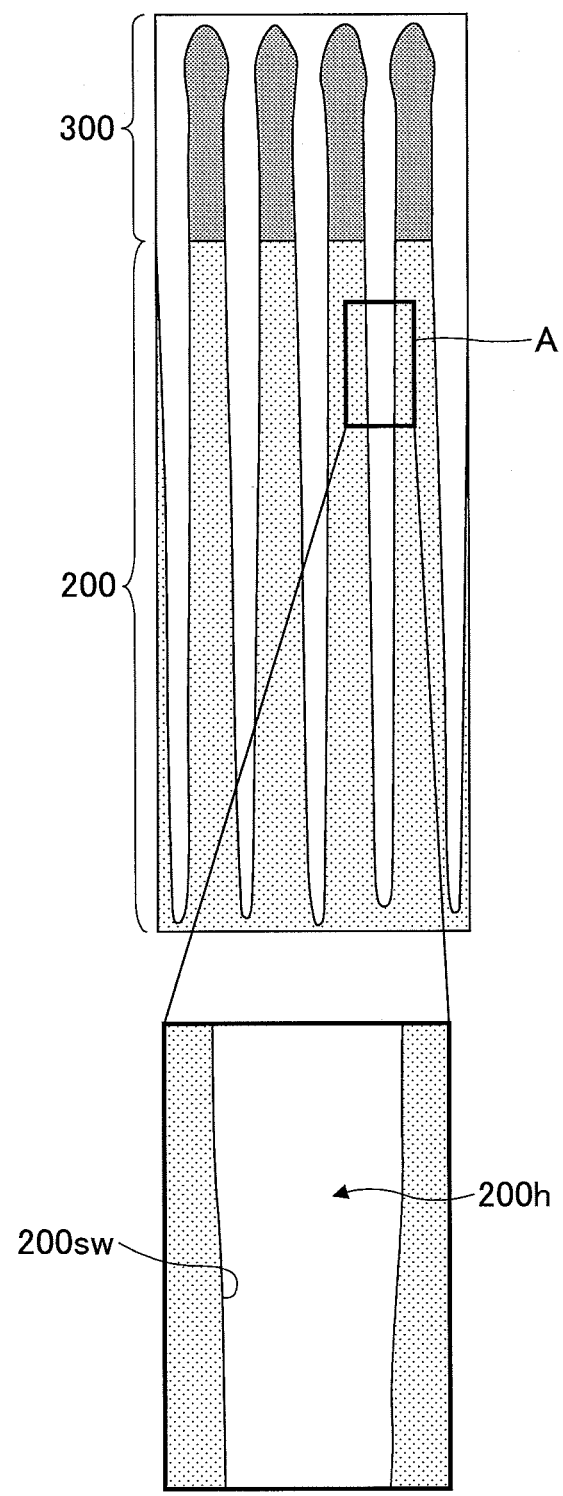
FIG. 6 is a cross sectional view of the laminated film on which the second operation of a second embodiment is performed.

FIG. 6 is a diagram illustrating an example result of the plasma etching of the second embodiment. A lower portion of FIG. 6 illustrates an enlarged cross sectional view corresponding to an area "A" illustrated in an upper portion of FIG. 6. Specifically, FIG. 6 illustrates a cross section of the laminated film 200 on which the second operation of the second embodiment is performed after the first operation.

As illustrated in FIG. 6, when the second processing gas that contains HBr is used as the etching gas to etch the laminated film 200, similarly to the first embodiment, the scalloping formed at the interface between the silicon oxide film 201 and the silicon nitride film 202 can be removed.

As described above, in the plasma etching method of the second embodiment, the laminated film 200 is etched using plasma generated from the second processing gas that contains bromine-containing gas after the laminated film 200 is etched using plasma generated from the first processing gas that contains fluorine-containing gas. Thus, the scalloping formed at the interface between the silicon oxide film 201 and the silicon nitride film 202 can be removed.

Herein above, although the plasma etching method has been described with respect to a above described embodiment for a complete and clear disclosure, the etching method is not to be thus limited but is to be construed as embodying all modifications and alternative constructions within a range of the present invention.

For example, the plasma etching method of the present disclosure can be applied not only to a case where the hole is formed in the laminated film but also to a case where the trench is formed in the laminated film.

Also, the plasma etching method of the present disclosure may be applied not only to the Capacitively Coupled Plasma (CCP) processing apparatus, but also to other etching apparatuses. An Inductively Coupled Plasma (ICP) processing apparatus, a plasma etching apparatus using a radial line slot antenna, Helicon Wave Plasma (HWP) processing apparatus, and an Electron Cyclotron Resonance Plasma (ECR) processing apparatus may be included in the other etching apparatuses.

Also, the etching apparatus may process various types of substrates such as a wafer, a large substrate used for a FPD (Flat Panel Display) and a substrate used for EL (Electro Luminescence) element or solar battery.

What is claimed is:

1. A plasma etching method comprising:
   generating a first plasma from a first processing gas that contains fluorine-containing gas and hydrogen-containing gas, by using a first radio frequency power that is output from a first radio frequency power supply,
   etching a laminated film consisting of alternating layers of at least one silicon oxide film layer and at least one silicon nitride film layer, with the first plasma; and
   generating a second plasma from a second processing gas that contains HBr gas, by using the first radio frequency power, and
   etching the laminated film with the second plasma to remove unevenness at the interface between adjacent silicon oxide and silicon nitride layers of the alternating layers of the at least one silicon oxide film layer and the at least one silicon nitride film layer.

2. The plasma etching method according to claim 1 wherein, unevenness formed at an interface between the silicon oxide film layer and the silicon nitride film layer is removed upon etching the laminated film with the second plasma.

3. The plasma etching method according to claim 1, wherein the first plasma and the second plasma are generated when a temperature of the laminated film is equal to or less than −30° C.

4. The etching method according to claim 1, wherein the second processing gas is generated by adding the bromine-containing gas to the first processing gas.

5. The plasma etching method according to claim 1, wherein the second processing gas is generated by adding bromine-containing gas to a processing gas, which processing gas is different from the first processing gas.

6. The plasma etching method according to claim 1, wherein
   in generating the second plasma, a second radio frequency power that is output from a second radio frequency power supply is applied in synchronization with the first radio frequency power, a frequency of the second radio frequency power being lower than a frequency of the first radio frequency power.

7. The plasma etching method according to claim 6, wherein in generating the second plasma, the second radio frequency power greater than the first radio frequency power is applied.

8. The plasma etching method according to claim 1, wherein the fluorine-containing gas is $CF_4$ and the hydrogen-containing gas is $H_2$.

* * * * *